United States Patent
Tang et al.

(10) Patent No.: US 12,183,752 B2
(45) Date of Patent: Dec. 31, 2024

(54) ARRAY SUBSTRATE

(71) Applicant: Wuhan China Star Optoelectronics Technology Co., Ltd., Hubei (CN)

(72) Inventors: Fuhsiung Tang, Hubei (CN); Fan Gong, Hubei (CN); Fei Ai, Hubei (CN); Jiyue Song, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/419,294

(22) PCT Filed: May 24, 2021

(86) PCT No.: PCT/CN2021/095384
§ 371 (c)(1),
(2) Date: Jun. 29, 2021

(87) PCT Pub. No.: WO2022/236868
PCT Pub. Date: Nov. 17, 2022

(65) Prior Publication Data
US 2024/0030248 A1    Jan. 25, 2024

(30) Foreign Application Priority Data
May 8, 2021 (CN) .......................... 202110501485.2

(51) Int. Cl.
*H01L 27/146* (2006.01)

(52) U.S. Cl.
CPC .. *H01L 27/14616* (2013.01); *H01L 27/14643* (2013.01); *H01L 27/14623* (2013.01)

(58) Field of Classification Search
CPC ......... H01L 27/14616; H01L 27/14643; H01L 27/14623
See application file for complete search history.

(56) References Cited

U.S. PATENT DOCUMENTS

| | | | |
|---|---|---|---|
| 9,159,866 B2* | 10/2015 | Lee | H01L 31/1055 |
| 10,790,341 B2* | 9/2020 | Guo | H01L 27/142 |
| 11,374,030 B2* | 6/2022 | Zhang | H01L 29/78633 |
| 12,027,543 B2* | 7/2024 | Tang | H01L 27/14612 |
| 2005/0199876 A1* | 9/2005 | Matsumoto | H01L 27/1214 257/64 |
| 2007/0291325 A1 | 12/2007 | Toyota et al. | |
| 2008/0185596 A1* | 8/2008 | Tseng | H01L 31/113 257/E31.083 |
| 2009/0050891 A1* | 2/2009 | Katoh | H01L 31/105 257/E33.001 |

(Continued)

FOREIGN PATENT DOCUMENTS

| | | |
|---|---|---|
| CN | 101339953 | 1/2009 |
| CN | 101452136 | 6/2009 |

(Continued)

*Primary Examiner* — Jarrett J Stark (57) ABSTRACT

An array substrate is disclosed. The array substrate includes a semiconductor layer integrated with a PIN photoelectric diode and an active area. The PIN photoelectric diode includes a P-type semiconductor area, an N-type semiconductor area, and an I-type semiconductor area defined between the P-type semiconductor area and the N-type semiconductor area. A gate electric current is introduced at a location corresponding to the I-type semiconductor area, so as to enhance light sensitivity.

20 Claims, 6 Drawing Sheets

(56) References Cited

U.S. PATENT DOCUMENTS

| | | | |
|---|---|---|---|
| 2009/0066897 A1* | 3/2009 | Katoh | G02F 1/13306 349/116 |
| 2010/0110096 A1* | 5/2010 | Satoh | G02F 1/136209 345/589 |
| 2010/0308345 A1* | 12/2010 | Brown | H01L 27/1446 250/208.2 |
| 2011/0175086 A1* | 7/2011 | Katoh | H01L 27/14643 257/53 |
| 2012/0104530 A1* | 5/2012 | Kaneko | G06F 3/042 257/433 |
| 2012/0273785 A1 | 11/2012 | Moriguchi et al. | |
| 2014/0291670 A1* | 10/2014 | Yamada | H01L 27/14612 257/53 |
| 2017/0162605 A1 | 6/2017 | Yamamoto et al. | |
| 2020/0091253 A1 | 3/2020 | Liu et al. | |
| 2021/0313364 A1* | 10/2021 | Li | G06V 40/1318 |

FOREIGN PATENT DOCUMENTS

| | | | | |
|---|---|---|---|---|
| CN | 101595514 | | 12/2009 | |
| CN | 106024633 | | 10/2016 | |
| CN | 108710237 | | 10/2018 | |
| CN | 110197834 | | 9/2019 | |
| CN | 111384072 | | 7/2020 | |
| CN | 111384072 A | * | 7/2020 | ......... G02F 1/13312 |
| CN | 111863906 | | 10/2020 | |
| CN | 112507828 | | 3/2021 | |
| CN | 112713161 | | 4/2021 | |
| JP | 2009128569 A | * | 6/2009 | |
| JP | 2010-232264 | | 10/2010 | |
| WO | WO-2022236868 A1 | * | 11/2022 | ....... H01L 27/14605 |

* cited by examiner

ARRAY SUBSTRATE

RELATED APPLICATIONS

This application is a National Phase of PCT Patent Application No. PCT/CN2021/095384 having International filing date of May 24, 2021, which claims the benefit of priority of Chinese Patent Application No. 202110501485.2 filed on May 8, 2021. The contents of the above applications are all incorporated by reference as if fully set forth herein in their entirety.

FIELD AND BACKGROUND OF THE INVENTION

The present disclosure relates to the technical field of display, and especially relates to an array substrate.

With the rapid development of display technology, consumers have increasingly higher requirements for functions of display panels. The display panels not only have to meet basic display requirements, such as high resolution, wide viewing angles, and high contrast, but also need to have some unique functions, so as to meet requirements of versatile application scenarios, thereby enhancing user experience, and thereby making the display panels more competitive on the market.

Technical Problem

At present, display panels equipped with light sensors are available and can achieve multiple important applications, such as fingerprint recognition, ambient light monitoring, UV sensing, and pulse measuring. The light sensor is a crucial module for converting light signals to electrical signals that can be read directly. The light sensor is usually mounted onto the display panel as a plug-in device, result in disadvantages, such as increased manufacturing costs, lowered density of integration of electrical components, low sensitivity, and poor aesthetics.

Therefore, there is an urgent need to develop a display panel that can change conventional mounting manners in which the light sensor is mounted onto the display panel as the plug-in device.

SUMMARY OF THE INVENTION

Technical Solution

The present disclosure provides an array substrate that can be applied in a display panel, thereby changing mounting manners applied in conventional techniques in which a light sensor is mounted onto the display panel as a plug-in device.

The technical solution of the present disclosure is as described herein below:
An array substrate, comprising:
  a substrate; and
  a semiconductor layer disposed on the substrate;
  wherein an active area and a photosensitive area are defined on the semiconductor layer, the active area includes a channel area, and the photosensitive area includes a P-type semiconductor area, a N-type semiconductor area, and an I-type semiconductor area laterally arranged, and the I-type semiconductor area is defined between the P-type semiconductor area and the N-type semiconductor area.

In some embodiments of the present disclosure, the array substrate further comprises: a gate layer disposed on the substrate, wherein an orthographic projection of the gate layer projected on the substrate covers an orthographic projection of the channel area projected on the substrate.

In some embodiments of the present disclosure, the array substrate further comprises:
  a first conductive layer disposed on the semiconductor layer and including a source and a drain respectively connected to the semiconductor layer; and
  a second conductive layer disposed on the first conductive layer and including an adjusting electrode, wherein an orthographic projection of the adjusting electrode projected on the substrate covers an orthographic projection of the I-type semiconductor area projected on the substrate.

In some embodiments of the present disclosure, the array substrate further comprises: a light shielding layer disposed between the substrate and the semiconductor layer and including a first light shielding layer and a second light shielding layer disposed at an interval, wherein an orthographic projection of the first light shielding layer projected on the substrate covers the orthographic projection of the channel area projected on the substrate, and an orthographic projection of the second light shielding layer projected on the substrate covers the orthographic projection of the I-type semiconductor area projected on the substrate;
  wherein the second conductive layer further includes an auxiliary adjusting electrode connected to the second light shielding layer.

Furthermore, the second conductive layer further includes an upper electrode, and the array substrate further includes a lower electrode disposed on the drain, an orthographic projection of the upper electrode projected on the substrate at least partially overlaps an orthographic projection of the lower electrode projected on the substrate, and a storage capacitor is formed between the upper electrode and the lower electrode.

Furthermore, the first conductive layer further includes a metal wire, and the second conductive layer further includes pixel electrodes connected to the metal wire.

In some embodiments of the present disclosure, the array substrate further comprises:
  a light shielding layer disposed between the substrate and the semiconductor layer and including a first light shielding layer and a second light shielding layer disposed at the interval, wherein an orthographic projection of the first light shielding layer projected on the substrate covers the orthographic projection of the channel area projected on the substrate, and an orthographic projection of the second light shielding layer projected on the substrate covers an orthographic projection of the I-type semiconductor area projected on the substrate;
  a first conductive layer disposed on the semiconductor layer and including a source and a drain respectively connected to the semiconductor layer; and
  a second conductive layer disposed on the first conductive layer and including an adjusting electrode connected to the second light shielding layer.

Furthermore, the second conductive layer further includes an upper electrode, and the array substrate further includes a lower electrode disposed on the drain, an orthographic projection of the upper electrode projected on the substrate at least partially overlaps an orthographic projection of the lower electrode projected on the substrate, and a storage capacitor is formed between the upper electrode and the lower electrode.

Furthermore, the first conductive layer further includes a metal wire, and the second conductive layer further includes pixel electrodes connected to the metal wire.

In some embodiments of the present disclosure, the active area further includes a first heavily doped area, a first lightly doped area, a second lightly doped area, and a second heavily doped area, the first lightly doped area and the second lightly doped area are each defined on one side of the channel area, respectively, the first heavily doped area is defined on a side of the first lightly doped area away from the channel area, and the second heavily doped area is defined on a side of the second lightly doped area away from the channel area; and one of the P-type semiconductor area and the N-type semiconductor area is connected to the second heavily doped area.

Furthermore, the P-type semiconductor area or the N-type semiconductor area connected to the second heavily doped area is made of same material as the second heavily doped area.

Furthermore, the array substrate further comprises a gate layer disposed on the substrate, wherein an orthographic projection of the gate layer projected on the substrate covers an orthographic projection of the channel area projected on the substrate.

In some embodiments of the present disclosure, the array substrate further comprises:
 a first conductive layer disposed on the semiconductor layer and including a source and a drain respectively connected to the semiconductor layer; and
 a second conductive layer disposed on the first conductive layer and including an adjusting electrode, wherein an orthographic projection of the adjusting electrode projected on the substrate covers an orthographic projection of the I-type semiconductor area projected on the substrate.

Furthermore, the array substrate further comprises a light shielding layer disposed between the substrate and the semiconductor layer and including a first light shielding layer and a second light shielding layer disposed at an interval, wherein an orthographic projection of the first light shielding layer projected on the substrate covers the orthographic projection of the channel area projected on the substrate, and an orthographic projection of the second light shielding layer projected on the substrate covers the orthographic projection of the I-type semiconductor area projected on the substrate;
 wherein the second conductive layer further includes an auxiliary adjusting electrode connected to the second light shielding layer.

In some embodiments of the present disclosure, the array substrate further comprises:
 a light shielding layer disposed between the substrate and the semiconductor layer and including a first light shielding layer and a second light shielding layer disposed at an interval, wherein an orthographic projection of the first light shielding layer projected on the substrate covers the orthographic projection of the channel area projected on the substrate, and an orthographic projection of the second light shielding layer projected on the substrate covers the orthographic projection of the I-type semiconductor area projected on the substrate;
 a first conductive layer disposed on the semiconductor layer and including a source and a drain respectively connected to the semiconductor layer; and
 a second conductive layer disposed on the first conductive layer and including an adjusting electrode connected to the second light shielding layer.

As an alternative solution, the active area and the photosensitive area are defined at an interval, and the active area and the photosensitive area are electrically connected.

An array substrate, comprising:
 a substrate;
 a light shielding layer disposed on the substrate;
 a buffer layer disposed on the substrate and covering the light shielding layer;
 a semiconductor layer disposed on the buffer layer and defining an active area and a photosensitive area, wherein the active area includes a channel area, and the photosensitive area includes a P-type semiconductor area, a N-type semiconductor area, and an I-type semiconductor area defined between the P-type semiconductor area and the N-type semiconductor area;
 a gate insulating layer disposed on the buffer layer and covering the semiconductor layer;
 a gate layer disposed on the gate insulating layer and located corresponding to the channel area;
 a layer insulating layer disposed on the gate insulating layer and covering the gate layer;
 a first conductive layer disposed on the semiconductor layer and including a source and a drain respectively connected to the semiconductor layer; and
 a second conductive layer disposed on the first conductive layer and including an adjusting electrode, wherein an orthographic projection of the adjusting electrode projected on the substrate covers an orthographic projection of the I-type semiconductor area projected on the substrate.

Furthermore, the light shielding layer includes a first light shielding layer and a second light shielding layer disposed at an interval, wherein an orthographic projection of the first light shielding layer projected on the substrate covers an orthographic projection of the channel area projected on the substrate, and an orthographic projection of the second light shielding layer projected on the substrate covers the orthographic projection of the I-type semiconductor area projected on the substrate An array substrate, comprising:
 a substrate;
 a light shielding layer disposed on the substrate and including a first light shielding layer and a second light shielding layer disposed at an interval, wherein an orthographic projection of the first light shielding layer projected on the substrate covers an orthographic projection of an channel area projected on the substrate, and an orthographic projection of the second light shielding layer projected on the substrate covers an orthographic projection of an I-type semiconductor area projected on the substrate;
 a buffer layer disposed on the substrate and covering the light shielding layer;
 a semiconductor layer disposed on the buffer layer and defining an active area and a photosensitive area, wherein the active area includes the channel area, and the photosensitive area includes a P-type semiconductor area, a N-type semiconductor area, and the I-type semiconductor area defined between the P-type semiconductor area and the N-type semiconductor area;
 a gate insulating layer disposed on the buffer layer and covering the semiconductor layer;
 a gate layer disposed on the gate insulating layer and located corresponding to the channel area;

a layer insulating layer disposed on the gate insulating layer and covering the gate layer;

a first conductive layer disposed on the semiconductor layer and including a source and a drain respectively connected to the semiconductor layer; and a second conductive layer disposed on the first conductive layer and including an adjusting electrode connected to the second light shielding layer.

Beneficial effects of the present invention:

Beneficial effects:

The array substrate is provided in the present disclosure. Firstly, the semiconductor layer of the array substrate is integrated with the active area and the photosensitive area, thereby changing the mounting manners applied in the conventional techniques in which a component having a light sensing function is mounted onto the display panel as the plug-in device, and thereby having advantages of lowering manufacturing costs and increasing a density of integration of electrical components. Secondly, the photosensitive area includes a PIN photoelectric diode. By introducing an electrical field above and/or below the I-type semiconductor area of the PIN photoelectric diode, thereby adjusting Fermi energy levels of the I-type semiconductor area, and thereby making the photosensitive area completely depleted, a diffusion of impurities and free carriers is reduced, and therefore a sensitivity of the photosensitive area is enhanced. Thirdly, the manufacturing method of the array substrate suits requirements of industrial production and does not affect an aperture ratio of a non-display area. When the semiconductor layer is made of low temperature poly-silicon (LTPS), compared with the conventional LTPS mass production method, only one photomask is added in the manufacturing method, therefore being beneficial to control the manufacturing costs of the array substrate.

DESCRIPTION OF SPECIFIC EMBODIMENTS OF THE INVENTION

To make the objects, features, and beneficial effects of the present invention clearly understood, the preferred embodiments are given hereinafter and are to be described in detail with reference to the accompanying drawings.

In the description of the present disclosure, it is to be understood that the oriental and the positional relationships of the terms "upper", "lower", "horizontal", "vertical", and "on a side of" etc. are based upon the oriental or positional relationship shown in the drawings, are merely for facilitating and simplifying the description of the present disclosure, and do not indicate or imply that the device or components referred to have a specific orientation, and are constructed and operated in a specific orientation. Therefore, it should not be construed as limiting the disclosure. Moreover, the terms "first" and "second" are used for descriptive purposes only and are not to be construed as indicating or implying a relative importance or implicitly indicating the number of indicated technical features. Thus, features defining "first" or "second" may include one or more of the described features either explicitly or implicitly. In the description of the present disclosure, the meaning of "a plurality of" is two or more unless specifically defined otherwise.

Embodiments of the present disclosure provides an array substrate that can be used in many different types of display panel, such as liquid crystal display (LCD) panels and organic light emitting display (OLED) panels. Compared with display panels equipped with light sensors in conventional techniques, the display panels comprising the array substrate change conventional mounting manners in which the light sensor is mounted onto the display panel as a plug-in device. That is, the light sensors are integrated in the array substrate, thereby being beneficial to control costs and increase a density of integration of electrical components. The array substrate applied in the LCD panels is taken as an example for the following discussion.

Figure 1:
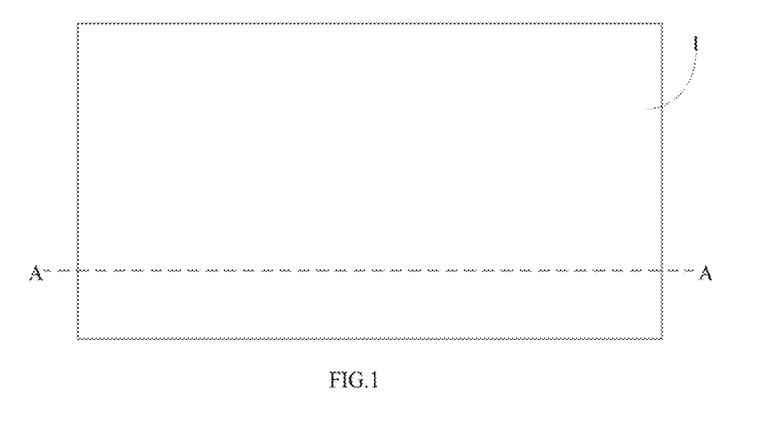
FIG. 1 is a top view of a array substrate provided by embodiments of the present disclosure.
Figure 2:
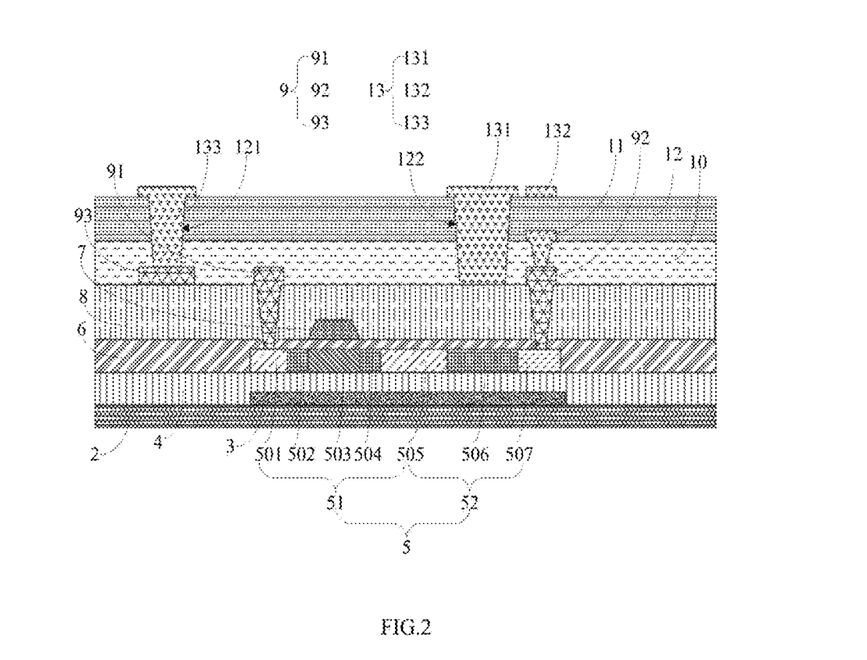
FIG. 2 is a schematic sectional view, taken along an A-A direction in FIG. 1, of an array substrate of an embodiment of the present disclosure.

FIG. 1 shows a top view of an array substrate provided by embodiments of the present disclosure, and FIG. 2 shows a schematic sectional view, taken along an A-A direction in FIG. 1, of an array substrate provided by an embodiment of the present disclosure. As shown in FIG. 1 and FIG. 2, the array substrate comprises: a substrate 2, a light shielding layer 3, a buffer layer 4, a semiconductor layer 5, a gate insulating layer 6, a gate layer 7, a layer insulating layer 8, a first conductive layer 9, a planarization layer 10, and a second conductive layer 13, disposed in order.

Specifically, the substrate 2 can be a rigid substrate, for example, be made of glass. The substrate 2 also can be a flexible substrate that can be made of at least one of polyimide (PI), poly(ether sulfone) (PES), polycarbonate (PC), polyethylene terephthalate (PET), polyethylene naphthalate (PEN), polyarylate (PAR), and glass-fiber-reinforced plastic (FRP).

The semiconductor layer 5 can be made of semi-conductive material, such as poly-silicon and amorphous silicon. Preferably, the semiconductor layer 5 is made of low temperature poly-silicon (LTPS). The semiconductor layer 5 is integrated with an active area 51 and a photosensitive area 52. Wherein the active area 51 is used for controlling the on and off of a thin-film transistor (TFT). The photosensitive area 52 includes a P-type semiconductor area, an I-type semiconductor area, and an N-type semiconductor area. The I-type semiconductor area is defined between the P-type semiconductor area and the N-type semiconductor area. The P-type semiconductor area, the I-type semiconductor area, and the N-type semiconductor area constitute a PIN photoelectric diode. The PIN photoelectric diode generates a photoelectrical current by absorbing light, thereby implementing a light sensing function.

Continue to refer to FIG. 2. The active area 51 includes a first heavily doped area 501, a first lightly doped area 502, a channel area 503, a second lightly doped area 504, and a second heavily doped area 505 laterally arranged. All of the doped areas are doped with the same type of doping ion. For example, the doped areas can be N-type doped areas, and the ions implanted can be boron ions or indium ions etc. As another example, the doped areas can be P-type doped areas, and the ions implanted can be phosphorus ions or arsenic ions etc.

Continue to refer to FIG. 2, the photosensitive area 52 shares the second heavily doped area 505 with the active area 51. That is, the photosensitive area 52 and the active area 51 are integrated. The second heavily doped area 505 corresponds to the P-type semiconductor area or the N-type semiconductor area of the photosensitive area 52, the I-type semiconductor area 506 is a lightly doped area or an un-doped area, a third heavily doped area 507 corresponds to the P-type semiconductor area or the N-type semiconductor area of the photosensitive area 52, and the third heavily doped area 507 and the second heavily doped area 505 are doped with different types of ions.

As an example, the first heavily doped area 501, the first lightly doped area 502, the second lightly doped area 504, and the second heavily doped area 505 are doped with N-type ions, the I-type semiconductor area 506 is a N-type lightly doped area, and the third heavily doped area 507 is a P-type heavily doped area.

As an example, the first heavily doped area 501, the first lightly doped area 502, the second lightly doped area 504, and the second heavily doped area 505 are doped with P-type ions, the I-type semiconductor area 506 is an un-doped area, and the third heavily doped area 507 is a N-type heavily doped area.

Figure 3:
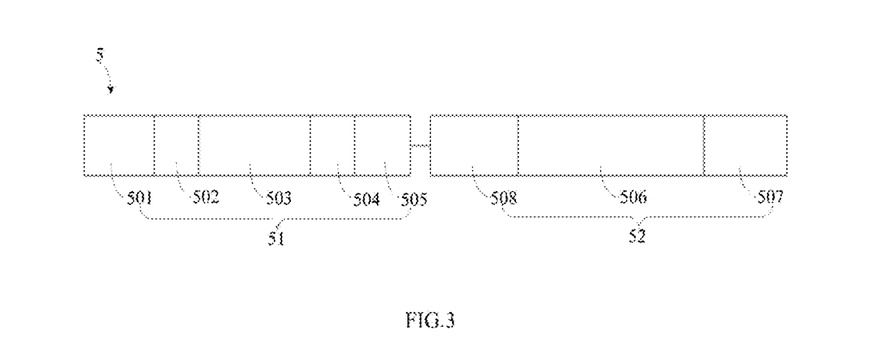
FIG. 3 is a structural schematic view of a semiconductor layer of an embodiment of the present disclosure.

As an alternative solution, FIG. 3 shows a structural schematic view of the semiconductor layer provided by an embodiment of the present disclosure.

Refer to FIG. 3. The active area 51 and the photosensitive area 52 are disposed at an interval, wherein the active area 51 includes the first heavily doped area 501, the first lightly doped area 502, the channel area 503, the second lightly doped area 504, and the second heavily doped area 505 laterally arranged, and the photosensitive area 52 includes a fourth heavily doped area 508, the I-type semiconductor area 506, and the third heavily doped area 507 laterally arranged. Wherein, the second heavily doped area 505 and the fourth heavily doped area 508 are doped with same type of ions, the second heavily doped area 505 and the fourth heavily doped area 508 are electrically connected, and the fourth heavily doped area 508 and the third heavily doped area 507 are doped with different types of ions. One may refer to the aforementioned examples for doping manners of each of the doped areas, which are not detailed herein again.

It is to be noted that other parameters of the semiconductor layer 5, such as thickness, and doping concentrations of each of the doped areas, are not specifically defined herein and can be selected according to the need. In addition, when the section shown in FIG. 2 is taken as a longitudinal section, a lateral section area of the photosensitive area 52 is preferably not less than a lateral section area of the active area 51, so as to enhance the photoelectrical current as much as possible, thereby enhancing a sensitivity of the photosensitive area 52.

Referring back to FIG. 2. The light shielding layer 3 is disposed on the substrate 2. The light shielding layer 3 is a patterned single-layered or laminated structure, and is made of opaque conductive material, for example, is made of a single metal, such as molybdenum (Mo), aluminum (Al), copper (Cu), and titanium (Ti). The light shielding layer 3 also can be made of alloy material such as molybdenum-titanium-nickel (MoTiNi) alloy.

The buffer layer 4 is disposed on the substrate 2 and completely covers the light shielding layer 3. The buffer layer 4 can be a single-layered structure or a laminated structure, and can be made of at least one of silicon oxide ($SiO_x$), silicon nitride ($SiN_x$), and silicon oxynitride ($SiO_xN_y$).

The gate insulating layer 6 is disposed on the buffer layer 4 and covers the semiconductor layer 5. The gate insulating layer 6 can be a single-layered structure or a laminated structure, and can be made of at least one of $SiO_x$, $SiN_x$, and $SiO_xN_y$. For example, the gate insulating layer 6 can be a single-layered structure made of silicon monoxide. As another example, the gate insulating layer 6 can be a laminated structure formed by $SiO_x$ layers and $SiN_x$ layers disposed alternately at intervals.

The gate layer 7 is disposed on the gate insulating layer 6 and is located corresponding to the channel area 503. That is, an orthographic projection of the gate layer 7 projected on the substrate 2 covers an orthographic projection of the channel area 503 projected on the substrate 2. The gate layer 7 can be a single-layered structure or a laminated structure, and can be made of conductive metal. It should be noted that the gate layer 7 in the embodiments of the present disclosure is of a top-gate type, and the gate layer 7 can also be of a bottom-gate type. For example, the gate layer 7 can be disposed between the substrate 2 and the semiconductor layer 5.

The layer insulating layer 8 is disposed on the gate insulating layer 6 and covers the gate layer 7. Refer to conventional technique for materials and structures of the layer insulating layer 8, which are not specifically limited herein. A first via 81 and a second via 82 running through the gate insulating layer 6 are formed in the layer insulating layer 8, thereby partially exposing the first heavily doped area 501 through the first via 81 and partially exposing the third heavily doped area 507 through the second via 82.

The first conductive layer 9 is disposed on the layer insulating layer 8 and includes a source 91, a drain 92, and metal wire 93. The source 91 is connected to the first heavily doped area 501 through the first via 81, and the drain 92 is connected to the third heavily doped area 507 through the second via 82. Refer to conventional technique for materials and structures of the source 91, the drain 92, and the metal wire 93, which are not specifically limited herein.

A planarization layer 10 is disposed on the layer insulating layer 8 and covers the first conductive layer 9. A third via 101 is formed in the planarization layer 10. The drain 92 is partially exposed through the third via 101. One can refer to conventional technics for materials and structures of the planarization layer 10, which are not specifically defined herein.

A second conductive layer 13 is disposed on the planarization layer 10. The second conductive layer 13 can be a single-layered structure or a laminated structure, and can be made of transparent conductive material, for example, be made of transparent metal oxide, such as indium tin oxide ($In_2O_3$:Sn, ITO), indium zinc oxide (ZnO:In, IZO), gallium zinc oxide (ZnO:Ga, GZO), and aluminum zinc oxide (ZnO:Al, AZO).

In addition, the array substrate 1 further comprises a lower electrode 11 disposed on the planarization layer 10. Wherein the lower electrode 11 is disposed on the first conductive layer 9 at a location corresponding to the drain 92. Refer to the second conductive layer 13 for materials and structures of the lower electrode 11.

In addition, the array substrate 1 further comprises a passivation layer 12 disposed on the planarization layer 10 and covers the lower electrode 11. A fourth via 121 and a fifth via 122 running through the planarization layer 10 are formed in the passivation layer 12, thereby partially exposing the metal wire 93 through the fourth via 121 and partially exposing the layer insulating layer 8 through the fifth via 122. Refer to conventional technique for materials and structures of the passivation layer 12, which are not specifically limited herein.

In the embodiments of the present disclosure, the second conductive layer 13 includes an adjusting electrode 131 for connecting a negative voltage. The adjusting electrode 131 is connected to the layer insulating layer 8 through the fifth via 122, and an orthographic projection of the adjusting electrode 131 projected on the substrate 2 covers an orthographic projection of the I-type semiconductor area 506 projected on the substrate 2. The adjusting electrode 131 is equivalent of a gate of the PIN photoelectric diode in the photosensitive area 52. The adjusting electrode 131 is configured for adjusting Fermi energy levels of the I-type semiconductor area 506 in the photosensitive area 52, thereby making the photosensitive area 52 completely depleted, thereby reducing a diffusion of impurities and free carriers, and thereby enhancing the sensitivity of the photosensitive area 52. Parameters regarding characteristics of the adjusting electrode 131 are not defined herein and can be selected according to the need. For example, an overall thickness of the adjusting electrode 131 can be 3-7000 Å and a permittivity of the adjusting electrode 131 can be 3-7.

In addition, the second conductive layer 13 further includes an upper electrode 132. A location of the upper electrode 132 corresponds to the lower electrode 11, and an orthographic projection of the upper electrode 132 projected on the substrate 2 at least partially overlaps an orthographic projection of the lower electrode 11 projected on the substrate 2. For example, the orthographic projection of the upper electrode 132 projected on the substrate 2 completely overlaps the orthographic projection of the lower electrode 11 projected on the substrate 2. A storage capacitor is formed between the upper electrode 132 and the lower electrode 11.

Furthermore, the second conductive layer 13 further includes pixel electrodes 133 connected to the metal wire 93 through the fourth via 121.

Advantages of the array substrate in the embodiments described hereinabove are as follows: Firstly, the PIN photoelectric diode is integrated on the semiconductor layer, thereby changing the mounting manners applied in the conventional techniques in which the light sensor is mounted onto the display panel as the plug-in device, and thereby having advantages of lowering the manufacturing costs and improving the density of integration of the electrical components. Secondly, the adjusting electrode is additionally disposed to serve as the gate of the PIN photoelectric diode in the photosensitive area. By introducing an electrical field above and the I-type semiconductor area of the PIN photoelectric diode using the adjusting electrode, thereby adjusting the Fermi energy levels of the I-type semiconductor area, and thereby making the photosensitive area completely depleted, the diffusion of the impurities and the free carriers is reduced, and therefore the sensitivity of the photosensitive area is enhanced. Thirdly, the adjusting electrode, the upper electrode, and the pixel electrodes can be manufactured in a same photo-masking procedure, therefore having advantages of economizing on photomasks and simplifying manufacturing procedures.

Figure 4:
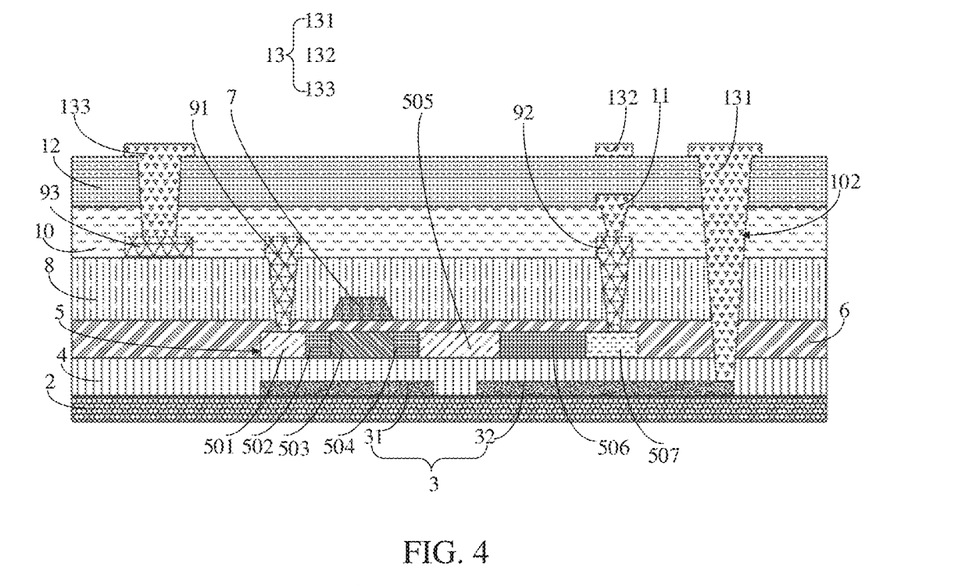
FIG. 4 is a schematic sectional view, taken along the A-A direction in FIG. 1, of an array substrate of another embodiment of the present disclosure.

FIG. 4 shows a schematic sectional view, taken along the A-A direction in FIG. 1, of an array substrate of another embodiment of the present disclosure. Main differences between the array substrate shown in FIG. 4 and the array substrate shown in FIG. 2 are that the light shielding layer 3 is disposed differently, and in the array substrate shown in FIG. 4, the adjusting electrode 131 is disposed at a different location, so as to introduce a gate electric current below the I-type semiconductor area 506 of the PIN photoelectric diode.

Specifically, as shown in FIG. 4, the light shielding layer 3 includes a first light shielding layer 31 and a second light shielding layer 32 disposed at an interval. An orthographic projection of the first light shielding layer 31 projected on the substrate 2 covers the orthographic projection of the channel area 503 projected on the substrate 2, and an orthographic projection of the second light shielding layer 32 projected on the substrate 2 covers the orthographic projection of the I-type semiconductor area 506 projected on the substrate 2.

The second conductive layer 13 includes the adjusting electrode 131, the upper electrode 132, and the pixel electrodes 133. Refer to the embodiments described hereinabove for structure, function, and location of the upper electrode 132 and the pixel electrodes 133, and for their connecting relationship with the other layers. The adjusting electrode 131 is disposed on one side of the upper electrode 132, the lower electrode 11, the drain 92, and the semiconductor layer 5. In addition, a sixth via 102 running through the passivation layer 12, the planarization layer 10, the layer insulating layer 8, the gate insulating layer 6, and the buffer layer 4, is formed in the array substrate. The adjusting electrode 131 is connected to the second light shielding layer 32 through the sixth via 102, and the adjusting electrode 131 is not electrically connected to the first light shielding layer 31.

Advantages of the array substrate shown in FIG. 4 are: Firstly, the PIN photoelectric diode is integrated on the semiconductor layer, thereby changing the mounting manners applied in the conventional techniques in which the light sensor is mounted onto the display panel as the plug-in device, thereby having the advantages of lowering the manufacturing costs and improving the density of integration of the electrical components. Secondly, the adjusting electrode is additionally disposed. By an electrical conduction between the adjusting electrode and the second light shielding layer, the second light shielding layer serves as the gate of the PIN photoelectric diode in the photosensitive area, so as to introduce an electrical field below the I-type semiconductor area of the PIN photoelectric diode, thereby adjusting the Fermi energy levels of the I-type semiconductor area, and thereby making the photosensitive area completely depleted, so as to reduce the diffusion of the impurities and the free carriers, thereby enhancing the sensitivity of the photosensitive area. Thirdly, the adjusting electrode, the upper electrode, and the pixel electrodes can be manufactured in the same photo-masking procedure, and therefore having the advantages of saving the photomasks and simplifying the manufacturing procedures.

Figure 5:
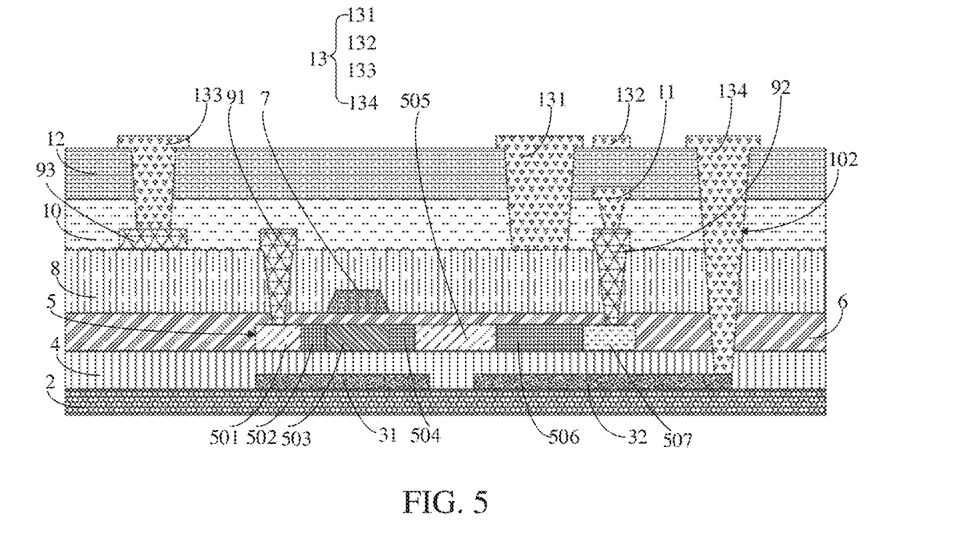
FIG. 5 is a schematic sectional view, taken along the A-A direction in FIG. 1, of an array substrate of another embodiment of the present disclosure.

FIG. 5 shows a schematic sectional view, taken along the A-A direction in FIG. 1, of an array substrate provided by another embodiment of the present disclosure. A main difference between the array substrate shown in FIG. 5 and the array substrate shown in FIG. 4 is that the second conductive layer 13 is disposed differently and includes the adjusting electrode 131 and an auxiliary adjusting electrode 134.

Specifically, refer to FIG. 5, the second conductive layer 13 includes the adjusting electrode 131, the upper electrode 132, the pixel electrodes 133, and the auxiliary adjusting electrode 134. Refer to the array substrate shown in FIG. 2 for structure, function, and location of the upper electrode 132 and the pixel electrodes 133, and for their connecting relationship with the other layers. The orthographic projection of the adjusting electrode 131 projected on the substrate 2 covers the orthographic projection of the I-type semiconductor area 506 projected on the substrate 2. The auxiliary adjusting electrode 134 is disposed on one side of the upper electrode 132, the lower electrode 11, the drain 92, and the semiconductor layer 5. In addition, the sixth via 102 running through the passivation layer 12, the planarization layer 10, the layer insulating layer 8, the gate insulating layer 6, and the buffer layer 4, is formed in the array substrate. The auxiliary adjusting electrode 134 is connected to the second light shielding layer 32 through the sixth via 102, and the auxiliary adjusting electrode 134 is not electrically connected to the first light shielding layer 31.

Advantages of the array substrate shown in FIG. 5 are: Firstly, the PIN photoelectric diode is integrated on the semiconductor layer, thereby changing the mounting manners applied in the conventional techniques in which the light sensor is mounted onto the display panel as the plug-in device, and thereby having the advantages of lowering the manufacturing costs and improving the density of integration of the electrical components. Secondly, the adjusting electrode and the auxiliary adjusting electrode are disposed, thereby introducing an electrical field above the I-type semiconductor area in the PIN photoelectric diode using the adjusting electrode, and thereby introducing an electrical field below the I-type semiconductor area in the PIN photoelectric diode using an electrical conduction between the auxiliary adjusting electrode and the second light shielding layer. That is, by using both the adjusting electrode and the second light shielding layer as the gate of the PIN photoelectric diode in the photosensitive area, the Fermi energy levels of the I-type semiconductor area are adjusted, the photosensitive area is completely depleted, and the diffusion of the impurities and the free carriers is reduced, and therefore the sensitivity of the photosensitive area is enhanced. Thirdly, the adjusting electrode, the auxiliary adjusting electrode, the upper electrode, and the pixel electrodes may all be manufactured in the same photo-masking procedure, therefore having the advantages of saving the photomasks and simplifying the manufacturing procedures.

The embodiments of the present disclosure also provides a method for manufacturing array substrates, so as to manufacture the array substrate of the embodiments described hereinabove. The manufacturing method is suitable for industrial production.

The array substrate shown in FIG. 2 is taken as an example, so as to elaborate the manufacturing method. In the array substrate, the active area 51 includes the first heavily doped area 501, the first lightly doped area 502, the channel area 503, the second lightly doped area 504, and the second heavily doped area 505 laterally arranged, the photosensitive area 52 shares the second heavily doped area 505 with the active area 51, ions implanted into the first heavily doped area 501, the first lightly doped area 502, the second lightly doped area 504, the second heavily doped area 505, and the I-type semiconductor area 506 are N-type ions, and the third heavily doped area 507 is a P-type heavily doped area.

Figure 6:
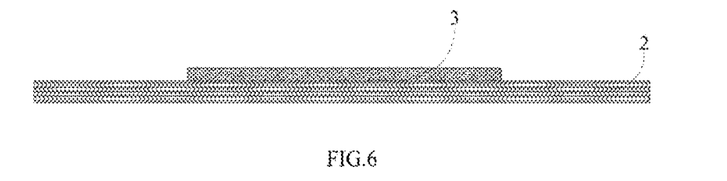
FIG. 6 is a structural schematic view of a product after a step S1 of a method for manufacturing the array substrate provided by embodiments of the present disclosure.

The manufacturing method is described in detail hereinbelow. As shown in FIG. 6 to FIG. 14, the manufacturing method comprises the following steps:

S1: providing a substrate 2, forming a whole layer of light shielding layer material on the substrate 2, and patterning the light shielding layer material to obtain a light shielding layer 3 having a patterned structure, as shown in FIG. 6.

Specifically, the whole layer of the light shielding layer material is deposited on the substrate 2 by applying a chemical vapor deposition (CVD) procedure. Then by applying a photolithography procedure, the light shielding layer material is patterned, a light shielding layer pattern is defined, and the light shielding layer 3 having the patterned structure is formed. The photolithography procedure is a common technical mean known by one skill in the art and including steps of: coating photoresist, exposure, developing, and drying.

As an alternative implementation of the step S1, an ink jet printing (IJP) procedure can be applied to print on the substrate, thereby forming the light shielding layer 3 having the patterned structure.

Figure 7:
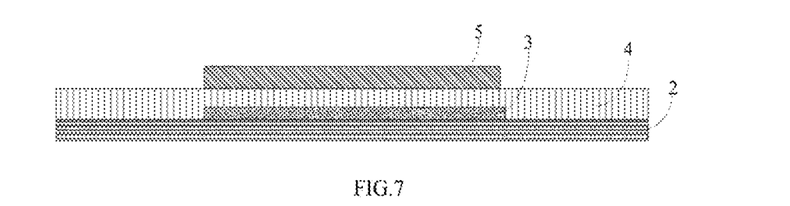
FIG. 7 is a structural schematic view of a product after a step S2 and a step S3 of the method for manufacturing the array substrate provided by embodiments of the present disclosure.

S2: forming a whole layer of buffer layer material on the substrate 2, and completely covers the light shielding layer 3, thereby obtaining a buffer layer 4.

Specifically, the CVD procedure is applied to deposit the buffer layer 4 on the substrate. Alternatively, the IJP procedure is applied to print the buffer layer 4 on the substrate.

S3: forming a whole layer of semi-conductive material on the buffer layer 4, and patterning the semi-conductive material to obtain a semiconductor layer 5 having a patterned structure.

Specifically, the whole layer of the semi-conductive material is deposited on the buffer layer 4 by applying the CVD procedure. Then by applying the photolithography procedure, the semi-conductive material is patterned, a semiconductor layer pattern is defined, and the semiconductor layer 5 having a patterned structure is formed. An example of the semi-conductive material is the low temperature poly-silicon.

As an alternative implementation of the step S3, the IJP procedure can be applied to print on the buffer layer 4, thereby forming the semiconductor layer 5 having the patterned structure.

A laminated structure obtained after the steps S2 and S3 is as shown in FIG. 7.

Figure 8:
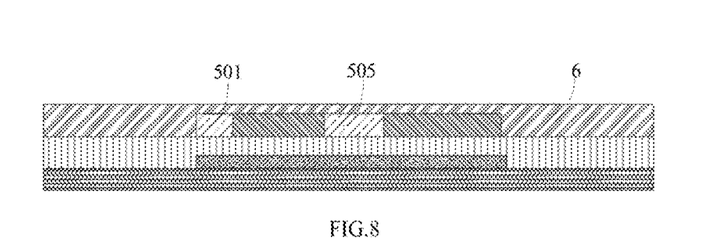
FIG. 8 is a structural schematic view of a product after a step S4, a step S5, and a step S6 of the method for manufacturing the array substrate provided by embodiments of the present disclosure.

S4: predefining an active area and a photosensitive area on the semiconductor layer 5. Wherein, predefining a first heavily doped area, a first lightly doped area, a channel area, a second lightly doped area, and a second heavily doped area in the active area, and predefining a P-type semiconductor area, an I-type semiconductor area, and a N-type semiconductor area in the photosensitive area, wherein the N-type semiconductor area overlaps the second heavily doped area.

S5: preforming a first ion doping procedure to the semiconductor layer 5, thereby obtaining the first heavily doped area 501 and the second heavily doped area 505.

Specifically, ion implanting and high temperature activating procedures are applied to dope the predefined first heavily doped area 501 and second heavily doped area 505 with phosphorus ions, thereby turning them into N-type heavily doped areas. The ion implanting and high temperature activating procedures are common technical means of LTPS production line procedures in the field to which the present disclosure pertains.

S6: forming a whole layer of gate insulating material on the buffer layer 4 and covering the semiconductor layer 5, thereby obtaining a gate insulating layer 6.

Specifically, the CVD procedure is applied to deposit the gate insulating layer 6 on the buffer layer 4. Alternatively, the IJP procedure is applied to print the gate insulating layer 6 on the buffer layer 4.

A laminated structure obtained after the steps S4, S5, and S6 is as shown in FIG. 8.

Figure 9:
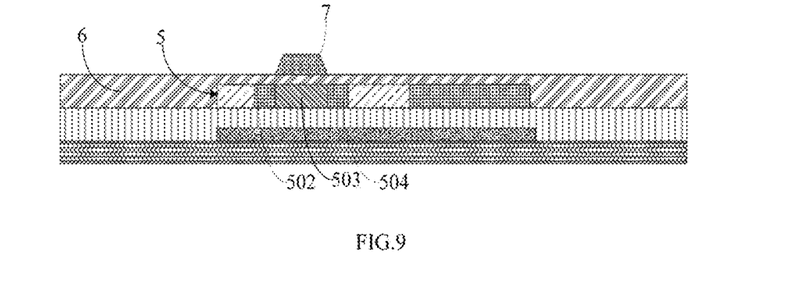
FIG. 9 is a structural schematic view of a product after a step S7 and a step S8 of the method for manufacturing the array substrate provided by embodiments of the present disclosure.

S7: forming a whole layer of gate material on the gate insulating layer 6, and patterning the gate material to obtain a gate layer 7 having a patterned structure. A position of the gate layer 7 corresponds to the predefined channel area 503.

Specifically, the whole layer of the gate material is deposited on the gate insulating layer 6 by applying a physical vapor deposition (PVD) procedure. Then by applying the photolithography procedure, the gate material is patterned, a gate pattern is defined, and the gate layer 7 having the patterned structure is formed.

As an alternative implementation of the step S7, the IJP procedure can be applied to print on the gate insulating layer 6, thereby forming the gate layer 7 having the patterned structure.

S8: using the gate layer as a self-alignment, preforming a second ion doping procedure to the semiconductor layer 5, thereby obtaining the first lightly doped area 502 and the second lightly doped area 504, and making the predefined I-type semiconductor area and third heavily doped area become lightly doped areas same as the first lightly doped area 502 and the second lightly doped area 504.

Specifically, the ion implanting and high temperature activating procedures are applied to dope the predefined first lightly doped area 502, second lightly doped area 504, I-type semiconductor area 506, and a third heavily doped area 507 with phosphorus ions, thereby turning them into N-type heavily doped areas.

A laminated structure obtained after the steps S7 and S8 is as shown in FIG. 9.

Figure 10:
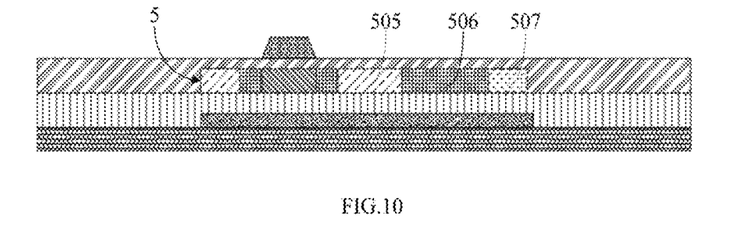
FIG. 10 is a structural schematic view of a product after a step S9 of the method for manufacturing the array substrate provided by embodiments of the present disclosure.

S9: preforming a third ion doping procedure to the semiconductor layer 5, thereby obtaining the third heavily doped area 507. The third heavily doped area 507 is a P-type semiconductor area, and a lightly doped area between the third heavily doped area 507 and the second heavily doped area 505 is the I-type semiconductor area, as shown in FIG. 10.

Specifically, the ion implanting and high temperature activating procedures are applied to dope the predefined third heavily doped area 507 with boron ions, thereby turning the predefined third heavily doped area 507 into a P-type heavily doped area.

Figure 11:
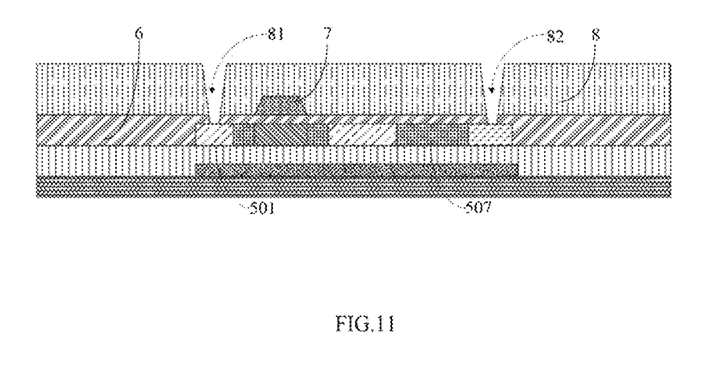
FIG. 11 is a structural schematic view of a product after a step S10 of the method for manufacturing the array substrate provided by embodiments of the present disclosure.

S10: forming a whole layer of layer insulating material on the gate insulating layer 6 and covering the gate layer 7, thereby obtaining a layer insulating layer 8. Then a first via 81 and a second via 82 running through the gate insulating layer 6 are formed in the layer insulating layer 8, thereby partially exposing the first heavily doped area 501 through the first via 81 and partially exposing the third heavily doped area 507 through the second via 82, as shown in FIG. 11.

Specifically, the CVD procedure is applied to deposit the layer insulating layer 8 on the gate insulating layer 6. Alternatively, the IJP procedure is applied to print the layer insulating layer 8 on the gate insulating layer 6.

Figure 12:
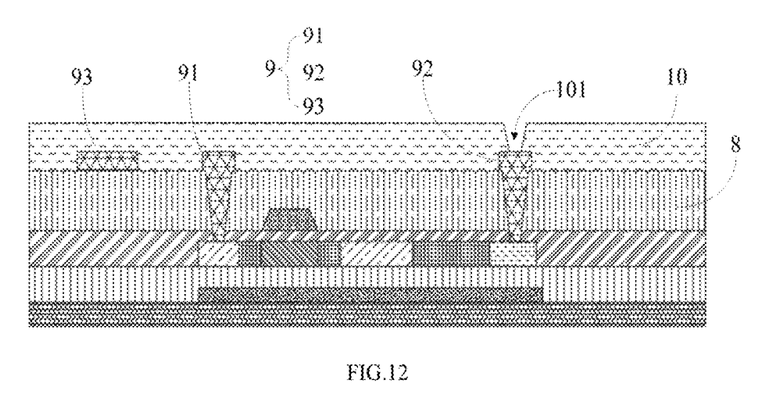
FIG. 12 is a structural schematic view of a product after a step S11 and a step S12 of the method for manufacturing the array substrate provided by embodiments of the present disclosure.

S11: forming a whole layer of first conductive material on the layer insulating layer 8, and patterning the first conductive material to obtain a first conductive layer 9 having a patterned structure. The first conductive layer 9 includes a source 91, a drain 92, and a metal wire 93. The source 91 is connected to the first heavily doped area 501 through the first via 81, and the drain 92 is connected to the third heavily doped area 507 through the second via 82.

Specifically, the whole layer of the first conductive material is deposited on the layer insulating layer 8 by applying the PVD procedure. Then by applying the photolithography procedure, the first conductive material is patterned, a source pattern, a drain pattern, and a metal wire pattern are defined, and the source 91, the drain 92, and the metal wire 93, each having a respective patterned structure, are formed.

As an alternative implementation of the step S11, the IJP procedure can be applied to print on the layer insulating layer 8, thereby forming the source 91, the drain 92, and the metal wire 93 each having the respective patterned structure.

S12: forming a whole layer of planarization layer material on the layer insulating layer 8 and covering the layer first conductive layer 9, thereby obtaining a planarization layer 10. Then a third via 101 is formed in the planarization layer 10, thereby partially exposing the drain 92 through the third via 101.

Specifically, the CVD procedure is applied to deposit the planarization layer 10 on the layer insulating layer 8. Alternatively, the IJP procedure is applied to print the planarization layer 10 on the layer insulating layer 8.

A laminated structure obtained after the steps S11 and S12 is as shown in FIG. 12.

Figure 13:
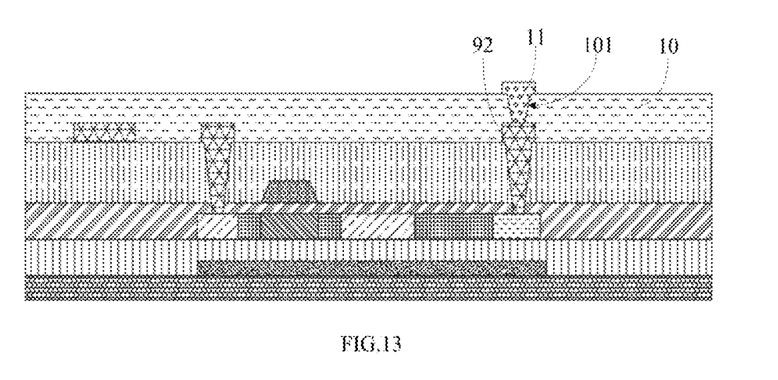
FIG. 13 is a structural schematic view of a product after a step S13 of the method for manufacturing the array substrate provided by embodiments of the present disclosure.

S13: forming a whole layer of lower electrode material on the planarization layer 10, and patterning the lower electrode material to obtain a lower electrode 11 having a patterned structure and connected to the drain 92 through the third via 101, as shown in FIG. 13.

Specifically, the whole layer of the lower electrode material is deposited on the planarization layer 10 by applying the PVD procedure. Then by applying the photolithography procedure, the lower electrode material is patterned, a lower electrode pattern is defined, and the lower electrode 11 having the patterned structure is formed.

As an alternative implementation of the step S11, the IJP procedure can be applied to print on the planarization layer 10, thereby forming the lower electrode 11 having the patterned structure.

Figure 14:
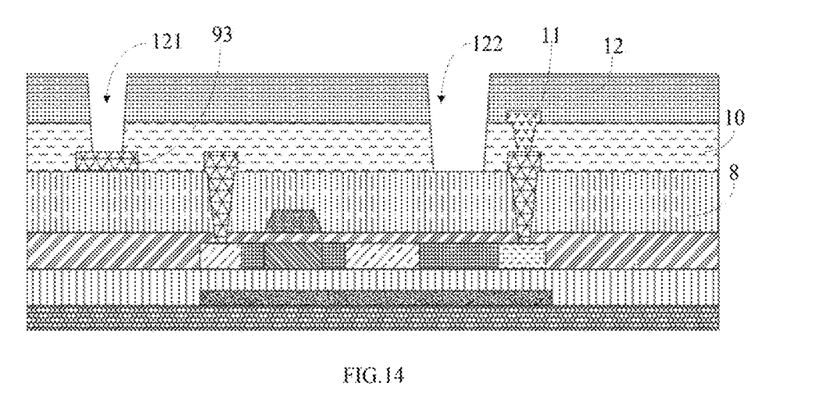
FIG. 14 is a structural schematic view of a product after a step S14 of the method for manufacturing the array substrate provided by embodiments of the present disclosure.

S14: forming a whole layer of passivation layer material on the planarization layer 10 and covering the lower electrode 11, thereby obtaining a passivation layer 12. Then a fourth via 121 and a fifth via 122 running through the planarization layer are formed in the passivation layer 12, thereby partially exposing the metal wire 93 through the fourth via 121 and partially exposing the layer insulating layer 8 in the fifth via 122, as shown in FIG. 14.

Specifically, the CVD procedure is applied to deposit the passivation layer 12 on the planarization layer 10. Alternatively, the IJP procedure is applied to print the passivation layer 12 on the planarization layer 10.

S15: forming a whole layer of second conductive material on the passivation layer 12, and patterning the second conductive material to obtain a second conductive layer 13 having a patterned structure. The second conductive layer 13 includes an adjusting electrode 131, an upper electrode 132, and pixel electrodes 133. The adjusting electrode 131 is connected to the layer insulating layer 8 through the fifth via 122. The upper electrode 132 is located corresponding to the lower electrode 11, so as to form a storage capacitor between the upper electrode 132 and the lower electrode 11, and the pixel electrodes 133 are connected to the metal wire 93 through the fourth via 121, thereby forming the array substrate as shown in FIG. 2.

Specifically, the whole layer of the second conductive material is deposited on the passivation layer 12 by applying the PVD procedure. Then by applying the photolithography procedure, the second conductive material is patterned, a second conductive layer pattern is defined, and the second conductive layer 13 having the patterned structure is formed.

As an alternative implementation of the step S15, the IJP procedure can be applied to print on the second passivation layer 12, thereby forming the second conductive layer 13 having the patterned structure.

For the manufacturing method of the array substrate shown in FIG. 4 and FIG. 5, those skilled in the art can make an adaptive adjustment to the corresponding structure based on the manufacturing method provided above, which will not be redundantly described herein.

The features of the manufacturing method provided by the embodiments of the present disclosure are as follows: the method suits requirements of industrial production and does not affect an aperture ratio of a non-display area. When the semiconductor layer is made of LTPS, compared with the conventional LTPS mass production method, only one photomask is added in the manufacturing method, therefore being beneficial to control the manufacturing costs of the array substrate.

The display panel applying the array substrate provided by the embodiments of the present disclosure can be used in many types of display devices. The display devices can be any products or parts thereof having display function, such as: cellphones, computers, digital cameras, digital video cameras, game consoles, audio playback devices, information terminal devices, intelligential wearable devices, intelligential electronic scales, automotive displays, and televisions. Wherein, the intelligential wearable devices can be smart wristbands, smart watches, and smart glasses. Although the invention has been described in conjunction with specific embodiments thereof, the above descriptions are intended only to serve as examples. It is to be noted that the present invention is not limited to the disclosed embodiments, and is intended to embrace all alternatives, modifications and variations that fall within the spirit and broad scope of the appended claims.

What is claimed is:

1. An array substrate, comprising:
  a substrate;
  a light shielding layer disposed on the substrate in a vertical direction perpendicular to an upper surface of the substrate and including a first light shielding layer and a second light shielding layer disposed at an interval in a horizontal direction perpendicular to the vertical direction;
  a semiconductor layer disposed over the light shielding layer in the vertical direction, wherein an active area and a photosensitive area are defined in the semiconductor layer and in direct contact with each other, the active area includes a channel area, the photosensitive area includes a P-type semiconductor area, a N-type semiconductor area, and an I-type semiconductor area arranged in the horizontal direction, the I-type semiconductor area is defined between the P-type semiconductor area and the N-type semiconductor area, the channel area overlaps the first light shielding layer in the vertical direction, and the I-type semiconductor area overlaps the second light shielding layer in the vertical direction;
  a first conductive layer disposed above the semiconductor layer in the vertical direction, wherein the first conductive layer includes a source and a drain extending in the vertical direction and respectively connected to the active area and the P-type semiconductor area in the semiconductor layer;
  a passivation layer disposed above the first conductive layer in the vertical direction; and
  an auxiliary adjusting electrode adjacent to and spaced apart from the first conductive layer in the horizontal direction,
  wherein the auxiliary adjusting electrode penetrates the passivation layer and extends in the vertical direction downwardly to be connected to the second light shielding layer and serve as the gate of a PIN photoelectric diode formed of the P-type semiconductor area, the N-type semiconductor area, and the I-type semiconductor area in the photosensitive area, to introduce a gate electric current at a location of the second light shielding layer directly below the I-type semiconductor area, thereby adjusting a Fermi energy level of the I-type semiconductor area.

2. The array substrate as claimed in claim 1, further comprising: a gate layer disposed above the substrate, wherein the gate layer overlaps the channel area in the vertical direction.

3. The array substrate as claimed in claim 2, further comprising: a second conductive layer at least partially above the passivation layer,
  wherein the second conductive layer comprises an adjusting electrode above the passivation layer and the auxiliary adjusting electrode, and wherein the adjusting electrode overlaps the I-type semiconductor area in the vertical direction.

4. The array substrate as claimed in claim 3, wherein the second conductive layer further includes an upper electrode, and the array substrate further includes a lower electrode disposed on the drain, the upper electrode at least partially overlaps the lower electrode in the vertical direction, and a storage capacitor is formed between the upper electrode and the lower electrode.

5. The array substrate as claimed in claim 3, wherein the first conductive layer further includes a metal wire, and the second conductive layer further includes pixel electrodes connected to the metal wire.

6. The array substrate as claimed in claim 1, wherein the active area further includes a first heavily doped area, a first lightly doped area, a second lightly doped area, and a second heavily doped area, the first lightly doped area and the second lightly doped area are each defined on one side of the channel area, respectively, the first heavily doped area is defined on a side of the first lightly doped area away from the channel area, and the second heavily doped area is defined on a side of the second lightly doped area away from the channel area; and one of the P-type semiconductor area and the N-type semiconductor area is connected to the second heavily doped area.

7. The array substrate as claimed in claim 6, wherein the P-type semiconductor area or the N-type semiconductor area connected to the second heavily doped area is made of same material as the second heavily doped area.

8. The array substrate as claimed in claim 6, further comprising a gate layer disposed above the substrate, wherein the gate layer overlaps the channel area in the vertical direction.

9. The array substrate as claimed in claim 8, further comprising: a second conductive layer at least partially above the passivation layer,
wherein the second conductive layer comprises an adjusting electrode above the passivation layer and the auxiliary adjusting electrode, and wherein the adjusting electrode overlaps the I-type semiconductor area in the vertical direction.

10. An array substrate, comprising:
a substrate;
a light shielding layer disposed on the substrate in a vertical direction perpendicular to an upper surface of the substrate and including a first light shielding layer and a second light shielding layer disposed at an interval in a horizontal direction perpendicular to the vertical direction;
a buffer layer disposed above the substrate in the vertical direction and covering the light shielding layer;
a semiconductor layer disposed on the buffer layer in the vertical direction and defining an active area and a photosensitive area in direct contact with each other, wherein the active area includes a channel area, the photosensitive area includes a P-type semiconductor area, a N-type semiconductor area, and an I-type semiconductor area defined between the P-type semiconductor area and the N-type semiconductor area in the horizontal direction, the channel area overlaps the first light shielding layer in the vertical direction, and the I-type semiconductor area overlaps the second light shielding layer in the vertical direction;
a gate insulating layer disposed on the buffer layer and covering the semiconductor layer;
a gate layer disposed on the gate insulating layer and located corresponding to the channel area;
a layer insulating layer disposed on the gate insulating layer and covering the gate layer;
a first conductive layer disposed on the semiconductor layer in the vertical direction, wherein the first conductive layer includes a source and a drain penetrating the layer insulating layer in the vertical direction, extending through the gate insulating layer in the vertical direction and respectively connected to the active area and the P-type semiconductor area in the semiconductor layer;
a passivation layer disposed above the first conductive layer in the vertical direction; and
an auxiliary adjusting electrode adjacent to and spaced apart from the first conductive layer in the horizontal direction,
wherein the auxiliary adjusting electrode penetrates the passivation layer and extends in the vertical direction downwardly to be connected to the second light shielding layer and serve as the gate of a PIN photoelectric diode formed of the P-type semiconductor area, the N-type semiconductor area, and the I-type semiconductor area in the photosensitive area, to introduce a gate electric current at a location of the light shielding layer directly below the I-type semiconductor area, thereby adjusting a Fermi energy level of the I-type semiconductor area.

11. The array substrate as claimed in claim 10, further comprising: a second conductive layer at least partially above the passivation layer,
wherein the second conductive layer includes an adjusting electrode above the passivation layer and the auxiliary adjusting electrode, and wherein the adjusting electrode overlaps the I-type semiconductor area in the vertical direction.

12. The array substrate as claimed in claim 10, further comprising: a second conductive layer at least partially above the passivation layer, wherein the second conductive layer includes an upper electrode above the passivation layer and the auxiliary adjusting electrode, and the array substrate further includes a lower electrode disposed on the drain, the upper electrode at least partially overlaps the lower electrode in the vertical direction, and a storage capacitor is formed between the upper electrode and the lower electrode.

13. The array substrate as claimed in claim 12, wherein the first conductive layer further includes a metal wire, and the second conductive layer further includes pixel electrodes connected to the metal wire.

14. The array substrate as claimed in claim 10, wherein the active area further includes a first heavily doped area, a first lightly doped area, a second lightly doped area, and a second heavily doped area, the first lightly doped area and the second lightly doped area are each defined on one side of the channel area, respectively, the first heavily doped area is defined on a side of the first lightly doped area away from the channel area, and the second heavily doped area is defined on a side of the second lightly doped area away from the channel area; and one of the P-type semiconductor area and the N-type semiconductor area is connected to the second heavily doped area.

15. The array substrate as claimed in claim 14, wherein the P-type semiconductor area or the N-type semiconductor area connected to the second heavily doped area is made of same material as the second heavily doped area.

16. An array substrate, comprising:
a substrate;
a light shielding layer disposed on the substrate in a vertical direction perpendicular to an upper surface of the substrate and including a first light shielding layer and a second light shielding layer disposed at an interval in a horizontal direction perpendicular to the vertical direction;
a buffer layer disposed above the substrate in the vertical direction and covering the light shielding layer;
a semiconductor layer disposed on the buffer layer in the vertical direction and defining an active area and a photosensitive area in direct contact with each other, wherein the active area includes the channel area, the photosensitive area includes a P-type semiconductor area, a N-type semiconductor area, and the I-type semiconductor area defined between the P-type semiconductor area and the N-type semiconductor area in the horizontal direction, the channel area overlaps the first light shielding layer in the vertical direction, and the I-type semiconductor area overlaps the second light shielding layer in the vertical direction;
a gate insulating layer disposed on the buffer layer and covering the semiconductor layer;
a gate layer disposed on the gate insulating layer and located corresponding to the channel area;
a layer insulating layer disposed on the gate insulating layer and covering the gate layer;
a first conductive layer disposed above the semiconductor layer in the vertical direction, wherein the first conductive layer includes a source and a drain penetrating the layer insulating layer in the vertical direction, extending through the gate insulating layer in the vertical direction and respectively connected to the active area and the P-type semiconductor area in the semiconductor layer;
a passivation layer disposed above the first conductive layer in the vertical direction; and
an adjusting electrode adjacent to and spaced apart from the first conductive layer in the horizontal direction, wherein the adjusting electrode penetrates the passivation layer and extends in the vertical direction downwardly to be connected to the second light shielding layer and serve as the gate of a PIN photoelectric diode formed of the P-type semiconductor area, the N-type semiconductor area, and the I-type semiconductor area in the photosensitive area, to introduce a gate electric current at a location of the second light shielding layer directly below the I-type semiconductor area, thereby adjusting a Fermi energy level of the I-type semiconductor area.

17. The array substrate as claimed in claim 16, further comprising: a second conductive layer at least partially above the passivation layer, wherein the second conductive layer includes an upper electrode above the passivation layer and the adjusting electrode, and the array substrate further includes a lower electrode disposed on the drain, the upper electrode at least partially overlaps the lower electrode in the vertical direction, and a storage capacitor is formed between the upper electrode and the lower electrode.

18. The array substrate as claimed in claim 17, wherein the first conductive layer further includes a metal wire, and the second conductive layer further includes pixel electrodes connected to the metal wire.

19. The array substrate as claimed in claim 16, wherein the active area further includes a first heavily doped area, a first lightly doped area, a second lightly doped area, and a second heavily doped area, the first lightly doped area and the second lightly doped area are each defined on one side of the channel area, respectively, the first heavily doped area is defined on a side of the first lightly doped area away from the channel area, and the second heavily doped area is defined on a side of the second lightly doped area away from the channel area; and one of the P-type semiconductor area and the N-type semiconductor area is connected to the second heavily doped area.

20. The array substrate as claimed in claim 19, wherein the P-type semiconductor area or the N-type semiconductor area connected to the second heavily doped area is made of same material as the second heavily doped area.

* * * * *